United States Patent
Fuke et al.

(10) Patent No.: US 8,031,443 B2
(45) Date of Patent: Oct. 4, 2011

(54) MAGNETO-RESISTANCE EFFECT ELEMENT, MAGNETIC HEAD, MAGNETIC RECORDING/REPRODUCING DEVICE AND METHOD FOR MANUFACTURING A MAGNETO-RESISTANCE EFFECT ELEMENT

(75) Inventors: Hiromi Fuke, Yokohama (JP); Susumu Hashimoto, Nerima-ku (JP); Masayuki Takagishi, Kunitachi (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 888 days.

(21) Appl. No.: 12/071,589

(22) Filed: Feb. 22, 2008

(65) Prior Publication Data

US 2008/0239590 A1    Oct. 2, 2008

(30) Foreign Application Priority Data

Mar. 27, 2007    (JP) ................ P2007-081991

(51) Int. Cl.
  *G11B 5/39* (2006.01)
(52) U.S. Cl. .................................... 360/324.1
(58) Field of Classification Search .............. 360/324.1
  See application file for complete search history.

(56) References Cited

U.S. PATENT DOCUMENTS

| 5,206,590 A | 4/1993 | Dieny et al. |
| 5,287,238 A | 2/1994 | Baumgart et al. |
| 5,304,975 A | 4/1994 | Saito et al. |
| 5,313,186 A | 5/1994 | Schuhl et al. |
| 5,448,515 A | 9/1995 | Fukami et al. |
| 5,459,687 A | 10/1995 | Sakakima et al. |
| 5,549,978 A | 8/1996 | Iwasaki et al. |
| 5,576,915 A | 11/1996 | Akiyama et al. |
| 5,668,688 A | 9/1997 | Dykes et al. |
| 5,715,121 A | 2/1998 | Sakakima et al. |
| 5,768,181 A | 6/1998 | Zhu et al. |
| 5,768,183 A | 6/1998 | Zhu et al. |
| 5,777,542 A | 7/1998 | Ohsawa et al. |
| 5,900,324 A | 5/1999 | Moroishi et al. |
| 5,923,504 A | 7/1999 | Araki et al. |
| 5,936,402 A | 8/1999 | Schep et al. |
| 5,949,622 A | 9/1999 | Kamiguchi et al. |

(Continued)

FOREIGN PATENT DOCUMENTS

CN    1431651    7/2003

(Continued)

OTHER PUBLICATIONS

Garcia et al., "Magnetoresistance in Excess of 200% in Ballistic Ni Nanocontacts at Room Temperature and 100 Oe," *Physical Review Letters*, vol. 82, No. 14, (1999), pp. 2923-2926.

(Continued)

*Primary Examiner* — Mark Blouin
(74) *Attorney, Agent, or Firm* — Nixon & Vanderhye, P.C.

(57) ABSTRACT

A magneto-resistance effect element, including: a first magnetization layer of which a magnetization is substantially fixed in one direction; a second magnetization layer of which a magnetization is rotated in accordance with an external magnetic field; an intermediate layer which contains insulating portions and magnetic metallic portions and which is provided between the first magnetic layer and the second magnetic layer; and a pair of electrodes to flow current in a direction perpendicular to a film surface of a multilayered film made of the first magnetic layer, the intermediate layer and the second magnetic layer; wherein the magnetic metallic portions of the intermediate layer contain non-ferromagnetic metal.

18 Claims, 3 Drawing Sheets

U.S. PATENT DOCUMENTS

| | | |
|---|---|---|
| 5,962,080 A | 10/1999 | Tan et al. |
| 6,002,553 A | 12/1999 | Stearns et al. |
| 6,013,365 A | 1/2000 | Dieny et al. |
| 6,016,241 A | 1/2000 | Coffey et al. |
| 6,025,979 A | 2/2000 | Yamane et al. |
| 6,033,584 A | 3/2000 | Ngo et al. |
| 6,074,743 A | 6/2000 | Araki et al. |
| 6,088,195 A | 7/2000 | Kamiguchi et al. |
| 6,090,498 A | 7/2000 | Omata et al. |
| 6,096,434 A | 8/2000 | Yano et al. |
| 6,111,729 A | 8/2000 | Kamiguchi et al. |
| 6,114,056 A | 9/2000 | Inomata et al. |
| 6,117,569 A | 9/2000 | Lin et al. |
| 6,127,045 A | 10/2000 | Gill |
| 6,132,892 A | 10/2000 | Yoshikawa et al. |
| 6,159,593 A | 12/2000 | Iwasaki et al. |
| 6,205,008 B1 | 3/2001 | Gijs et al. |
| 6,219,275 B1 | 4/2001 | Nishimura |
| 6,221,518 B1 | 4/2001 | Araki et al. |
| 6,258,470 B1 | 7/2001 | Sakakima et al. |
| 6,275,363 B1 | 8/2001 | Gill |
| 6,303,218 B1 | 10/2001 | Kamiguchi et al. |
| 6,313,973 B1 | 11/2001 | Fuke et al. |
| 6,330,137 B1 | 12/2001 | Knapp et al. |
| 6,340,533 B1 | 1/2002 | Ueno et al. |
| 6,341,052 B2 | 1/2002 | Hayashi |
| 6,348,274 B1 | 2/2002 | Kamiguchi et al. |
| 6,353,318 B1 | 3/2002 | Sin et al. |
| 6,368,706 B1 | 4/2002 | Iwasaki et al. |
| 6,400,537 B2 | 6/2002 | Sakakima et al. |
| 6,452,763 B1 | 9/2002 | Gill |
| 6,469,926 B1 | 10/2002 | Chen |
| 6,473,275 B1 | 10/2002 | Gill |
| 6,495,275 B2 | 12/2002 | Kamiguchi et al. |
| 6,517,896 B1 | 2/2003 | Horng et al. |
| 6,519,123 B1 | 2/2003 | Sugawara et al. |
| 6,522,507 B1 | 2/2003 | Horng et al. |
| 6,556,390 B1 | 4/2003 | Mao et al. |
| 6,560,077 B2 * | 5/2003 | Fujiwara et al. ........... 360/324.1 |
| 6,567,246 B1 | 5/2003 | Sakakima et al. |
| 6,603,642 B1 | 8/2003 | Araki et al. |
| 6,636,391 B2 | 10/2003 | Watanabe et al. |
| 6,674,615 B2 | 1/2004 | Hayashi |
| 6,686,068 B2 | 2/2004 | Carey et al. |
| 6,690,163 B1 | 2/2004 | Hoshiya et al. |
| 6,710,984 B1 | 3/2004 | Yuasa et al. |
| 6,720,036 B2 | 4/2004 | Tsunekawa et al. |
| 6,759,120 B2 | 7/2004 | Jongill et al. |
| 6,767,655 B2 | 7/2004 | Hiramoto et al. |
| 6,770,382 B1 | 8/2004 | Chang et al. |
| 6,828,039 B2 * | 12/2004 | Sugawara .................. 428/621 |
| 6,853,520 B2 | 2/2005 | Fukuzawa et al. |
| 6,882,509 B2 | 4/2005 | Chang et al. |
| 6,903,907 B2 | 6/2005 | Hasegawa |
| 6,905,780 B2 | 6/2005 | Yuasa et al. |
| 6,929,957 B2 | 8/2005 | Min et al. |
| 6,937,446 B2 | 8/2005 | Kamiguchi et al. |
| 6,937,447 B2 | 8/2005 | Okuno et al. |
| 7,002,781 B2 * | 2/2006 | Sugawara ................ 360/324.11 |
| 7,008,702 B2 | 3/2006 | Fukuzawa et al. |
| 7,038,893 B2 | 5/2006 | Koui et al. |
| 7,046,489 B2 | 5/2006 | Kamiguchi et al. |
| 7,072,153 B2 | 7/2006 | Koui et al. |
| 7,116,529 B2 | 10/2006 | Yoshikawa et al. |
| 7,163,755 B2 | 1/2007 | Hiramoto et al. |
| 7,177,121 B2 | 2/2007 | Kojima et al. |
| 7,196,877 B2 | 3/2007 | Yoshikawa et al. |
| 7,218,484 B2 | 5/2007 | Hashimoto et al. |
| 7,223,485 B2 | 5/2007 | Yuasa et al. |
| 7,240,419 B2 | 7/2007 | Okuno et al. |
| 7,280,323 B2 * | 10/2007 | Sato et al. .................. 360/324.1 |
| 7,301,733 B1 | 11/2007 | Fukuzawa et al. |
| 7,304,825 B2 | 12/2007 | Funayama et al. |
| 7,331,100 B2 | 2/2008 | Li et al. |
| 7,372,672 B2 | 5/2008 | Nishiyama |
| 7,379,278 B2 | 5/2008 | Koui et al. |
| 7,390,529 B2 | 6/2008 | Li et al. |
| 7,405,906 B2 * | 7/2008 | Funayama et al. ............ 360/314 |
| 7,453,672 B2 | 11/2008 | Dieny et al. |
| 7,476,414 B2 | 1/2009 | Fukuzawa et al. |
| 7,495,870 B2 | 2/2009 | Yuasa et al. |
| 7,514,117 B2 | 4/2009 | Fukuzawa et al. |
| 7,525,776 B2 | 4/2009 | Fukuzawa et al. |
| 7,602,592 B2 | 10/2009 | Fukuzawa et al. |
| 7,610,674 B2 | 11/2009 | Zhang et al. |
| 7,776,387 B2 | 8/2010 | Fuji et al. |
| 7,782,575 B2 | 8/2010 | Tsuchiya et al. |
| 7,785,662 B2 | 8/2010 | Fuji et al. |
| 7,791,843 B2 * | 9/2010 | Kamiguchi et al. ...... 360/324.11 |
| 7,808,747 B2 * | 10/2010 | Fuji et al. ................... 360/324.1 |
| 7,810,228 B2 | 10/2010 | Yuasa et al. |
| 7,821,748 B2 | 10/2010 | Fukuzawa et al. |
| 7,897,201 B2 | 3/2011 | Yuasa et al. |
| 2001/0005300 A1 | 6/2001 | Hayashi |
| 2001/0009063 A1 | 7/2001 | Saito et al. |
| 2001/0014000 A1 | 8/2001 | Tanaka et al. |
| 2001/0040781 A1 | 11/2001 | Tanaka et al. |
| 2002/0048127 A1 | 4/2002 | Fukuzawa et al. |
| 2002/0048128 A1 | 4/2002 | Kamiguchi et al. |
| 2002/0051380 A1 | 5/2002 | Kamiguchi et al. |
| 2002/0054461 A1 | 5/2002 | Fujiwara et al. |
| 2002/0058158 A1 | 5/2002 | Odagawa et al. |
| 2002/0073785 A1 | 6/2002 | Prakash et al. |
| 2002/0114974 A1 | 8/2002 | Carey et al. |
| 2002/0126428 A1 | 9/2002 | Gill |
| 2002/0135935 A1 | 9/2002 | Covington |
| 2002/0145835 A1 | 10/2002 | Suzuki et al. |
| 2002/0150791 A1 | 10/2002 | Yuasa et al. |
| 2002/0159201 A1 | 10/2002 | Li et al. |
| 2002/0191355 A1 | 12/2002 | Hiramoto et al. |
| 2003/0011463 A1 | 1/2003 | Iwasaki et al. |
| 2003/0026049 A1 | 2/2003 | Gill |
| 2003/0035256 A1 | 2/2003 | Hayashi et al. |
| 2003/0049389 A1 | 3/2003 | Tsunekawa et al. |
| 2003/0053269 A1 | 3/2003 | Nishiyama |
| 2003/0053270 A1 | 3/2003 | Gill |
| 2003/0099868 A1 | 5/2003 | Tanahashi et al. |
| 2003/0104249 A1 | 6/2003 | Okuno et al. |
| 2003/0123200 A1 | 7/2003 | Nagasaka et al. |
| 2003/0128481 A1 | 7/2003 | Seyama et al. |
| 2003/0156360 A1 | 8/2003 | Kawawake et al. |
| 2004/0021990 A1 | 2/2004 | Koui et al. |
| 2004/0121185 A1 | 6/2004 | Fukuzawa et al. |
| 2004/0137645 A1 | 7/2004 | Hu et al. |
| 2004/0150922 A1 | 8/2004 | Kagami et al. |
| 2004/0169963 A1 | 9/2004 | Okuno et al. |
| 2004/0201929 A1 | 10/2004 | Hashimoto et al. |
| 2004/0206619 A1 | 10/2004 | Pinarbasi |
| 2004/0246631 A1 | 12/2004 | Dieny et al. |
| 2005/0042478 A1 | 2/2005 | Okuno et al. |
| 2005/0063104 A1 * | 3/2005 | Takagishi et al. .......... 360/324.2 |
| 2005/0068855 A1 | 3/2005 | Morikawa et al. |
| 2005/0073778 A1 | 4/2005 | Hasegawa et al. |
| 2005/0094317 A1 | 5/2005 | Funayama |
| 2005/0094322 A1 | 5/2005 | Fukuzawa et al. |
| 2005/0094327 A1 | 5/2005 | Okuno et al. |
| 2005/0141148 A1 | 6/2005 | Aikawa et al. |
| 2005/0168887 A1 * | 8/2005 | Yuasa et al. ............. 360/324.12 |
| 2005/0276998 A1 | 12/2005 | Sato |
| 2006/0002184 A1 | 1/2006 | Hong et al. |
| 2006/0018057 A1 | 1/2006 | Huai |
| 2006/0034022 A1 * | 2/2006 | Fukuzawa et al. .......... 360/324.1 |
| 2006/0050444 A1 * | 3/2006 | Fukuzawa et al. ............ 360/324 |
| 2006/0077596 A1 * | 4/2006 | Yuasa et al. ................. 360/324.1 |
| 2006/0098353 A1 | 5/2006 | Fukuzawa et al. |
| 2006/0114620 A1 | 6/2006 | Sbiaa et al. |
| 2006/0164764 A1 | 7/2006 | Kamiguchi et al. |
| 2006/0188750 A1 | 8/2006 | Ide et al. |
| 2007/0070556 A1 | 3/2007 | Zhang et al. |
| 2007/0081276 A1 | 4/2007 | Fukuzawa et al. |
| 2007/0091511 A1 * | 4/2007 | Hoshiya et al. ............. 360/324.1 |
| 2007/0092639 A1 | 4/2007 | Fuji et al. |
| 2007/0159733 A1 | 7/2007 | Hashimoto et al. |
| 2007/0172690 A1 | 7/2007 | Kim et al. |
| 2007/0188936 A1 | 8/2007 | Zhang et al. |
| 2007/0188937 A1 | 8/2007 | Carey et al. |
| 2007/0202249 A1 | 8/2007 | Yuasa et al. |

| | | |
|---|---|---|
| 2007/0253122 A1 | 11/2007 | Fukuzawa et al. |
| 2007/0259213 A1* | 11/2007 | Hashimoto et al. ......... 428/811.2 |
| 2008/0005891 A1 | 1/2008 | Yuasa et al. |
| 2008/0008909 A1 | 1/2008 | Fuji et al. |
| 2008/0013218 A1 | 1/2008 | Fuke et al. |
| 2008/0062577 A1 | 3/2008 | Fukuzawa et al. |
| 2008/0068764 A1 | 3/2008 | Fukuzawa et al. |
| 2008/0080098 A1 | 4/2008 | Fuke et al. |
| 2008/0102315 A1 | 5/2008 | Fukuzawa et al. |
| 2008/0106826 A1* | 5/2008 | Funayama et al. ............ 360/314 |
| 2008/0192388 A1 | 8/2008 | Zhang et al. |
| 2008/0204944 A1 | 8/2008 | Aikawa et al. |
| 2008/0239590 A1 | 10/2008 | Fuke et al. |
| 2008/0278864 A1 | 11/2008 | Zhang et al. |
| 2008/0311431 A1 | 12/2008 | Fuji et al. |
| 2009/0059441 A1 | 3/2009 | Zhang et al. |
| 2009/0061105 A1 | 3/2009 | Fukuzawa et al. |
| 2009/0091864 A1 | 4/2009 | Carey et al. |
| 2009/0091865 A1 | 4/2009 | Zhang et al. |
| 2009/0104475 A1 | 4/2009 | Fuji et al. |
| 2009/0109581 A1 | 4/2009 | Fukuzawa et al. |
| 2009/0141408 A1 | 6/2009 | Fukuzawa et al. |
| 2009/0162698 A1 | 6/2009 | Fukuzawa et al. |
| 2009/0225477 A1 | 9/2009 | Fukuzawa et al. |
| 2010/0037453 A1 | 2/2010 | Zhang et al. |
| 2010/0091412 A1 | 4/2010 | Yuasa et al. |
| 2010/0091414 A1 | 4/2010 | Yuasa et al. |
| 2010/0091415 A1 | 4/2010 | Yuasa et al. |
| 2010/0092803 A1 | 4/2010 | Yuasa et al. |
| 2010/0323104 A1 | 12/2010 | Yuasa et al. |

FOREIGN PATENT DOCUMENTS

| | | |
|---|---|---|
| CN | 1183517 | 1/2005 |
| CN | 1746980 * | 3/2006 |
| EP | 0 687 917 | 12/1995 |
| EP | 0 877 398 | 11/1998 |
| EP | 1 328 027 | 7/2003 |
| EP | 1 400 957 | 3/2004 |
| EP | 1 548 762 | 6/2005 |
| EP | 1 607 941 | 12/2005 |
| EP | 1 626 393 * | 2/2006 |
| GB | 2 390 168 | 12/2003 |
| JP | 08-049063 | 2/1996 |
| JP | 09-116212 | 5/1997 |
| JP | 09-306733 | 11/1997 |
| JP | 10-173252 | 6/1998 |
| JP | 10-324969 | 12/1998 |
| JP | 11-121832 | 4/1999 |
| JP | 11-154609 | 6/1999 |
| JP | 11-238923 | 8/1999 |
| JP | 11-296820 | 10/1999 |
| JP | 2000-137906 | 5/2000 |
| JP | 2000-156530 | 6/2000 |
| JP | 2000-188435 | 7/2000 |
| JP | 2000-215414 | 8/2000 |
| JP | 2000-228004 | 8/2000 |
| JP | 2000-293982 | 10/2000 |
| JP | 2001-094173 | 4/2001 |
| JP | 2001-143227 | 5/2001 |
| JP | 2001-176027 | 6/2001 |
| JP | 2001-229511 | 8/2001 |
| JP | 2001-237471 | 8/2001 |
| JP | 2001-358380 | 12/2001 |
| JP | 2002-076473 | 3/2002 |
| JP | 2002-124721 | 4/2002 |
| JP | 2002-150512 | 5/2002 |
| JP | 2002-204010 | 7/2002 |
| JP | 2002-208744 | 7/2002 |
| JP | 2003-086866 | 3/2003 |
| JP | 2003-110168 | 4/2003 |
| JP | 2003-152243 | 5/2003 |
| JP | 2003-204095 | 7/2003 |
| JP | 2004-006589 | 1/2004 |
| JP | 2004-153248 | 5/2004 |
| JP | 2004-214234 | 7/2004 |
| JP | 2005-097693 | 4/2005 |
| JP | 2005-136309 | 5/2005 |
| JP | 2005-166896 | 6/2005 |
| JP | 2005-339784 | 12/2005 |
| JP | 2005-353236 | 12/2005 |
| JP | 2006-019743 * | 1/2006 |
| JP | 2006-049426 | 2/2006 |
| JP | 2006-054257 * | 2/2006 |
| JP | 2006-135253 * | 5/2006 |
| JP | 2006-319343 * | 11/2006 |
| JP | 2007-221135 * | 8/2007 |
| KR | 10-0302029 | 6/2001 |
| KR | 2001-0081971 | 8/2001 |
| KR | 2002-0015295 | 2/2002 |
| KR | 10-2005-0027159 | 3/2005 |
| KR | 10-2005-0118649 | 12/2005 |
| KR | 10-2006-0050327 * | 5/2006 |
| WO | 97/47982 | 12/1997 |
| WO | 03/032338 | 4/2003 |

OTHER PUBLICATIONS

S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).*

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317. (Abstract).*

B. Dieny, et al., "Magnetotransport Properties of Magnetically Soft Spin-Valve Structures (Invited)", J. Appl. Phys., vol. 69 (8), Apr. 15, 1991, pp. 4774-4779.*

Dieny et al., "Giant Magnetoresistance of Magnetically Soft Sandwiches: Dependence on Temperature and on Layer Thicknesses", Physical Review B, vol. 45, No. 2, Jan. 1, 1992, pp. 806-813.*

D. Bozec, et al., "Comparative Study of the Magnetoresistance of MBE-Grown Multilayers: [Fe/Cu/Co/Cu]$_N$ and [Fe/Cu]$_N$ [Co/CU]$_N$ "Physical Review B, vol. 60, No. 5, Aug. 1, 1999, pp. 3037-3039. (Abstract).*

Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.*

Takagishi, M. et al., "The Applicability of CPP-GMR Heads for Magnetic Recording", IEEE Transactions on Magnetics, vol. 38, No. 5, pp. 2277-2282, (Sep. 2002).*

A. Losev et al., "Electron Beam Induced Reduction Ofof CuO in the Presence of a Surface Carbonaceous Layer: An XPS/Hreels Study", Surface Science 213 (1989) pp. 554-579.*

K.S. Kim et al., "X-Ray Photoelectron Spectroscopic Studies of Nickel-Oxygen Surfaces Using Oxygen and Argon Ion-Bombardment", Surface Science 43 (1974), pp. 625-643.*

J.J. Versluijs, et al., "Magnetoresistance of Half-Metallic Oxide Nanocontracts," Physical Review Letters, vol. 87, No. 2, Jul. 9, 2001, pp. 026601-1 through 026601-4.*

W.F. Egelhoff, et al., "Oxygen as a Surfactant in the Growth of Giant Magnetoresistance Spin Valves", J Appl. Phys., vol. 82, No. 12, pp. 6142-6151, Dec. 15, 1997.*

Y. Kamiguchi et al., "CoFe Specular Spin Valves With a Nano Oxide Layer", The 1999 IEEE International Magnetics Conference, May 18-21, 1999.*

H.A. Ferrera et al. "Rapid DNA hybridization based on ac field focusing of magnetically labeled target DNA"; Applied Physics Letters, 87, 013901 (2005); pp. 013901-1 to 013901-3.*

L. Lagae et al. "Magnetic biosensors for genetic screening of cystic fibrosis"; IEE Proc. Circuits Devices Syst. vol. 152, No. 4, Aug. 2005, pp. 393-400.*

Meguro, K., Hoshiya, H., Watanabe, K., Hamakawa, Y., and Fuyama, M., "Spin-valve films using syntehtic ferrimagnets for pinned layer," (IEEE Trans. Mag., 35(5), 1999, 2925-2927. (Abstract).*

C. Vouille et al, J.Appl.Phys. 81 4573 (1997); "Inverse CPP-GMR in (A/Cu/Co/Cu) multilayers . . . by impurities" (Abstract).*

A.C. Reilly et al, J.Magn. Magn. Mater, 195 (1999) L269; "Perpendicular giant magnetoresistance of . . . unified picture." (Abstract).*

J. Bass et al, J. Magn. Magn. Mater, 200 (1999) 274; "Current-perpendicular (CPP) magnetoresistance in magnetic metallic multilayers." (Abstract).*

L. Villa, et al., Journal of Applied Physics, vol. 87, No. 12, pp. 8610-8614, Current Perpendicular Magnetoresistances of NiFeCo and NiFe "Permalloys", Jun. 15, 2000. (Abstract).

Yonsei University Master Thesis, "Voltage Difference Amplification Circuit for Improving the Sensing Characteristics of MRAM", Dec. 2005 and brief English-language translation thereof.

Ceramist vol. 4 No. 5, Special Edition, "Magnetic Sensor Technologies and Applications Using Giant Magnetoresistance effect", Oct. 2001.

Seoul University Doctoral Thesis, A Study on the Development of New Spin Wave Structures for Magnetoresistive RAM based on Giant Magnetoresistance and Tunneling, Aug. 2001 and brief English-language translation thereof.

Nagasaka et al., "Giant magnetoresistance properties of specular spin valve films in a current perpendicular to plane structure," J. Appl. Phys., vol. 89, No. 11, pp. 6943-4965.

Mazin, "How to Define and Calculate the Degree of Spin Polarization in Ferromagnets", Physical Review Letters, vol. 83, No. 7, Aug. 16, 1999, pp. 1427-1430.

Fukuzawa et al., U.S. Appl. No. 11/001,174, filed Dec. 2, 2004.
Fukuzawa et al., U.S. Appl. No. 11/199,448, filed Aug. 9, 2005.
Fuji et al., U.S. Appl. No. 11/583,968, filed Oct. 20, 2006.
Yuasa et al., U.S. Appl. No. 11/703,830, filed Feb. 8, 2007.
Fukuzawa et al., U.S. Appl. No. 11/783,011, filed Apr. 5, 2007.
Fuji et al., U.S. Appl. No. 11/802,474, filed May 23, 2007.
Fuke et al., U.S. Appl. No. 11/822,700, filed Jul. 9, 2007.
Fuke et al., U.S. Appl. No. 11/892,890, filed Aug. 28, 2007.
Zhang et al., U.S. Appl. No. 11/906,716, filed Oct. 3, 2007.
Fukuzawa et al., U.S. Appl. No. 12/086,761, filed Jun. 19, 2008.
Fukuzawa et al., U.S. Appl. No. 12/248,578, filed Oct. 9, 2008.
Fuji et al., U.S. Appl. No. 12/314,811, filed Dec. 17, 2008.
Fukuzawa et al., U.S. Appl. No. 12/347,543, filed Dec. 31, 2008.
Yuasa et al., U.S. Appl. No. 12/585,851, filed Sep. 25, 2009.
Yuasa et al., U.S. Appl. No. 12/585,852, filed Sep. 25, 2009.
Yuasa et al., U.S. Appl. No. 12/585,854, filed Sep. 25, 2009.
Yuasa et al., U.S. Appl. No. 12/585,855, filed Sep. 25, 2009.

* cited by examiner

MAGNETO-RESISTANCE EFFECT ELEMENT, MAGNETIC HEAD, MAGNETIC RECORDING/REPRODUCING DEVICE AND METHOD FOR MANUFACTURING A MAGNETO-RESISTANCE EFFECT ELEMENT

CROSS-REFERENCE TO RELATED APPLICATIONS

This application is based upon and claims the benefit of priority from the prior Japanese Patent Application No. 2007-081991, filed on Mar. 27, 2007; the entire contents of which are incorporated herein by reference.

BACKGROUND OF THE INVENTION

1. Field of the Invention

The present invention relates to a magneto-resistance effect element which is configured such that a current is flowed in the direction perpendicular to the film surface thereof. The present invention also relates to a magnetic head, a magnetic recording/reproducing device which utilize the magneto-resistance effect element according to the present invention. Moreover, the present invention relates to a method for manufacturing a magneto-resistance effect element.

2. Description of the Related Art

Recently, the performance of a magnetic device, particularly such as a magnetic head is enhanced by means of Giant Magneto-Resistance Effect (GMR) made of a multilayered magnetic structure. Particularly, since a spin valve film (SV film) can exhibit a larger GMR effect, the SV film has developed the magnetic device such as a magnetic head and MRAM (Magnetic Random Access Memory).

The "spin valve" film has such a structure as sandwiching a non-magnetic metal spacer layer between two ferromagnetic layers and is configured such that the magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field. With the spin valve film, the large MR effect can be obtained by the variation of the relative angle in magnetization between the pinned layer and the free layer.

A conventional spin valve film is employed for a CIP (Current In plane)-GMR element. In the CIP-GMR element, a sense current is flowed to the SV film in the direction parallel to the film surface thereof. Recently, attention is paid to a CPP (Current Perpendicular to Plane)-GMR element and a TMR (Tunneling Magneto Resistance) element because the CPP-GMR element and the TMR element can exhibit the respective large MR effect in comparison with the CIP element.

Recently, it was confirmed that a large MR effect with high MR ratio can be obtained from the minute coupling of Ni wires (Reference 1).

Then, the minute magnetic coupling is formed three-dimensionally so as to realize a magneto-resistance effect element with high MR ratio (Reference 2). In this case, the three-dimensional minute magnetic coupling is carried out by means of EB (Electron beam) irradiation, FIB (Focused Ion beam) irradiation or AFM (Atomic Force Microscope).

[Reference 1] Phys. Rev. Lett. 82 2923 (1999)
[Reference 2] JP-A 2003-204095 (KOKAI)

It is considered that the MR effect as described above is originated from the rapid variation in magnetization at the minute magnetic coupling points. However, if the boundaries (wall surfaces) between the minute magnetic coupling points are roughed, the current (electrons) are scattered by the wall surfaces of the minute magnetic coupling points so that the ratio of the current contributing to the MR effect is decreased when the current is flowed so as to generate the MR effect. As a result, the variation loss in resistance of the minute magnetic coupling may occur so that the magneto-resistance effect element made of the minute magnetic coupling can not exhibit the inherent variation in magnetic resistance.

BRIEF SUMMARY OF THE INVENTION

An aspect of the present invention relates to a magneto-resistance effect element, including: a laminated body including a fixed magnetization layer of which a magnetization is substantially fixed in one direction, a free magnetization layer of which a magnetization is rotated in accordance with an external magnetic field, and an intermediate layer which is located between the fixed magnetization layer and the free magnetization layer; and a pair of electrodes for flowing a sense current perpendicular to a film surface of the laminated body, the electrodes being connected with a top surface and a bottom surface of the laminated body, respectively, wherein the intermediate layer contains an insulating portion, a magnetic metal portion penetrating through the insulating portion and compound portion to cover at least a side surface of the magnetic metal portions.

In another aspect, a method for manufacturing a magneto-resistance effect element, including: forming a plurality of metallic portions shaped in island which are separated from one another and which are formed on a fixed magnetization layer; forming a metallic layer on the fixed magnetization layer so as to embed the metallic portions; oxidizing, nitriding, oxynitriding or carbonizing the metallic layer; applying an energy to the metallic portions and the fixed magnetization layer so that at least one component of the fixed magnetization layer is pumped up and diffused into center portions of the metallic layer so as to form magnetic metal portions containing the at least one component of the fixed magnetization layer in the corresponding metallic portions, thereby forming an intermediate layer configured so as to contain the magnetic metal portions, insulating portions located between adjacent magnetic metal portions and compound portions to cover at least portions of side surfaced of the magnetic metal portions; forming a free magnetization layer on the intermediate layer so as to form a laminated body composed of the fixed magnetization layer, the intermediate layer and the free magnetization layer; and forming a pair of electrodes for flowing a sense current perpendicular to a film surface of the laminated body, the electrodes being connected with a top surface and a bottom surface of the laminated body, respectively.

DETAILED DESCRIPTION OF THE INVENTION

Hereinafter, the present invention will be described in detail with reference to the drawings.

According to the aspect of the present invention, an intermediate layer containing an insulating portion and a magnetic metal portions is provided between the fixed magnetization layer and the free magnetization layer to cause the magnetic coupling via the magnetic metal portions of the intermediate layer.

The magneto-resistance effect element as defined above can exhibit the MR effect originated from minute couplings of the magnetic metal portions which are separated by the insulating portions from one another. However, the boundary (wall surface) between the adjacent magnetic metal portion and insulating portion would be roughed due to the oxidation and atomic diffusion during the manufacturing process of the magneto-resistance effect element. As a result, when a current is flowed, the electrons are scattered at the wall surfaces to cause the variation loss in resistance so that the magneto-resistance effect element can not a sufficient MR effect.

However, in the aspect, the compound portions are provided so as to at least portions of the side walls of the magnetic metal portions so that the wall surfaces of the magnetic metal portions can be flattened so as to prevent the variation loss in resistance due to electron scattering. As a result, the intended magneto-resistance effect element can exhibit a large MR effect.

The compound portions functions as protective layers for the magnetic metal portions. Namely, the compound portions function as preventing the diffusion of the oxygen remaining in the insulating portions into the magnetic metal portions with time and the disappearance of the magnetic metal portions partially or entirely through oxidation. Therefore, the magneto-resistance effect element can exhibit the intended MR effect stably for a long time.

The magneto-resistance effect element may be manufactured by means of any process, but preferably by means of the following process: including; forming a plurality of metallic portions shaped in island which are separated from one another and which are formed on a fixed magnetization layer of which a magnetization is substantially fixed in one direction; forming a metallic layer on the fixed magnetization layer so as to embed the metallic portions; insulating the metallic layer through at least one of oxidizing, nitriding, oxynitriding and carbonizing; applying an energy to the metallic portions and the fixed magnetization layer so that at least one component of the fixed magnetization layer is pumped up and diffused into center portions of the metallic portions so as to form magnetic metal portions containing the at least one component of the fixed magnetization layer in the corresponding metallic portions, thereby forming an intermediate layer configured so as to contain the magnetic metal portions, insulating portions located between adjacent magnetic metal portions and compound portions to cover at least portions of side surfaces of the magnetic metal portions; forming a free magnetization layer on the intermediate layer so as to form a laminated body composed of the fixed magnetization layer, the intermediate layer and the free magnetization layer; and forming a pair of electrodes for flowing a sense current perpendicular to a film surface of the laminated body, the electrodes being connected with a top surface and a bottom surface of the laminated body, respectively.

According to the aspects relating to the manufacturing process, the magneto-resistance effect element can be manufactured easily.

In an embodiment, each compound portion contains a metal with a larger surface energy than a constituent material of the fixed magnetization layer. Alternatively, each compound portion contains a metal which has a smaller surface energy than a constituent material of the fixed magnetization layer and which satisfies the relation of $\Gamma_{AB}=2|(\gamma_A-\gamma_B)/(\gamma_A+\gamma_B)|\geq 0.5$ meaning a surface energy mismatch if a surface energy of the constituent material is defined as $\gamma_A$ and a surface energy of the metal is defined as $\gamma_B$.

According to the embodiment, the intermediate layer of the magneto-resistance effect element as configured above can be easily formed.

According to the aspects of the present invention can be provided magneto-resistance effect element which can exhibit the MR effect originated from the remarkable change in magnetization at the minute magnetic coupling points by suppressing the roughness of the boundaries (wall surfaces) of the minute magnetic coupling points so as to prevent the variation loss in magnetic resistance due to the scattering of electrons at the wall surfaces of the minute magnetic coupling points and thus, exhibit the large MR effect.

(Magneto-Resistance Effect Element)

Figure 1:
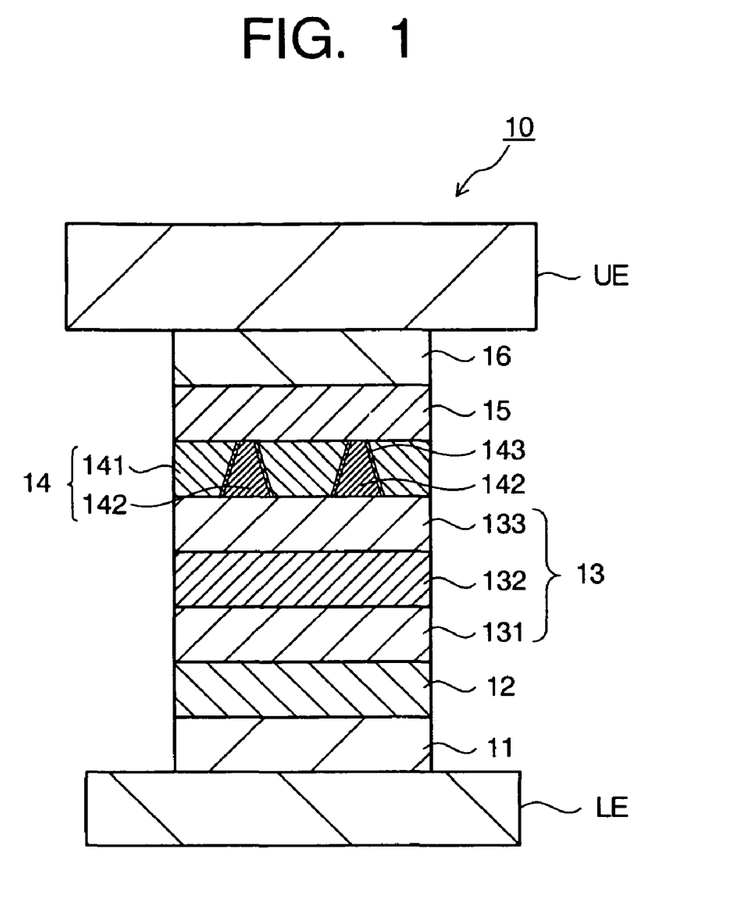
FIG. 1 is a structural view illustrating a magneto-resistance effect element according to an embodiment.

FIG. 1 is a structural view illustrating a magneto-resistance effect element according to an embodiment. In FIG. 1, the magneto-resistance effect element 10 is configured such that a plurality of films are formed between a bottom electrode LE and a top electrode UE. Concretely, an underlayer 11, an antiferromagnetic layer 12, a composite pinned layer 13, an intermediate layer 14, a free layer 15 and a protective layer 16 are subsequently formed on the bottom electrode LE. The composite pinned layer 13 is configured such that an antiparallel-magnetic coupling layer 132 is sandwiched between a first pinned layer 131 and a second pinned layer 133.

The intermediate layer 14 includes insulating portions 141 and magnetic metal portions 142 which are alternately arranged therein. Then, compound portions 143 are formed so as to cover the side surfaces of the magnetic metal portions 142.

In this embodiment, the composite pinned layer 13, the intermediate layer 14 and the free layer 15 constitute a spin valve film.

The composite pinned layer 13 corresponds to a first magnetic layer defined according to the present invention, of which the magnetization is fixed, and the free layer 15 corresponds to a second magnetic layer defined according to the present invention, of which the magnetization is rotated in accordance with an external magnetic field. Then, the intermediate layer 14 corresponds to an intermediate layer defined according to the present invention. The first magnetic layer may be made of a single magnetic layer instead of the composite pinned layer 13.

The bottom electrode LE and the top electrode UE function as flowing a sense current almost perpendicular to the thus obtained laminated body so that the magneto-resistance effect element 10 constitutes a CPP (Current Perpendicular to Plane) type magneto-resistance effect element which is configured such that the sense current is flowed perpendicular to the film surface of the element 10.

The underlayer 11 may be a two-layered structure of a buffer layer and a seed layer, for example. The buffer layer functions as mitigating the surface roughness of the bottom electrode LE, and thus, may be made of Ta, Ti, W, Zr, Hf, Cr and/or an alloy thereof. The seed layer functions as controlling the crystal orientation of the spin valve film, and thus, made of Ru, $(Fe_xNi_{1-x})_{100-y}X_y$ (X=Cr, V, Nb, Hf, Zr, Mo, 15<x<25, 20<y<45).

The antiferromagnetic layer 12 may be made of an antiferromagnetic material such as PtMn, PdPtMn, IrMn, RuRhMn. The antiferromagnetic layer 12 fixes the magnetization of the composite pinned layer 13 through the application of unidirectional anisotropy.

The first pinned layer 131 and the second pinned layer 133 of the composite pinned layer 13 may be made of Fe, Co, Ni, FeCo alloy, FeNi alloy, FeCoNi alloy, CoFeB alloy and the like. The antiparallel-magnetic coupling layer 132 functions as coupling the first pinned layer 131 and the second pinned layer 132 antiferromagnetically, and thus, may be made of Ru, Ir and/or Rh.

The insulating portion 141 of the intermediate layer 14 may be made of an oxide, a nitride, an oxynitride or a carbide containing at least one selected from the group consisting of Al, Mg, Li, Si, Ca, Sc, Ti, V, Cr, Mn, Fe, Co, Ni, Cu, Zn, Ga, Se, Sr, Y, Zr, Nb, Mo, Pd, Ag, Cd, In, Sn, Sb, Ba, Ka, Hf, Ta, W, Re, Pt, Hg, Pb, Bi and lanthanoid. Moreover, the insulating portion 141 may be made of another material which can insulate a current.

The magnetic metal portion 142 functions as a path to flow the current in the intermediate layer 14 along the stacking direction of the magneto-resistance effect element 10, and thus, made of a ferromagnetic material such as Fe, Co, Ni and an alloy thereof. Herein, if the manufacturing method is employed as will described below, the constituent material of the magnetic metal portion 142 depends on the constituent material of the composite pinned layer 13 because the magnetic metal portion 142 is made of the constituent material of the composite pinned layer 13 which is located below the magnetic metal portion 142.

When a magnetic field antiparallel to the magnetization of the second pinned layer 133 is applied to the free layer 15 so that the magnetization of the free layer 15 is rotated in accordance with the magnetic field, the magnetization of the second pinned layer 133 becomes antiparallel to the magnetization of the free layer 15. In this case, since the magnetic metal portions 142 are sandwiched by the two ferromagnetic layers (the composite pinned layer 13 and the free layer 15), the magnetic walls are formed at the magnetic metal portions 142.

The compound portion 143 of the intermediate layer 14 may be made of an oxide, a nitride, an oxynitride and a carbide. Particularly, if the manufacturing method is employed as will described below, the main component of the intermediate layer 14 is set different from the main components of the insulating portion 141 and the magnetic metal portion 142.

Concretely, the main component of the compound portion 143 can be a metal with a larger surface energy than Fe, Co, Ni composing the composite pinned layer 13. Alternatively, the main component of the compound portion 143 can be a metal which has a smaller surface energy than Fe, Co, Ni composing the composite pinned layer 13 and which satisfies the relation of $\Gamma_{AB}=2|(\gamma_A-\gamma_B)/(\gamma_A+\gamma_B)|\geqq0.5$ if the surface energy of the constituent material (Fe, Co, Ni, etc.) is defined as $\gamma_A$ and the surface energy of the metal is defined as $\gamma_B$. The relation of $\Gamma_{AB}=2|(\gamma_A-\gamma_B)/(\gamma_A+\gamma_B)|$ means a surface energy mismatch. Although the upper limited value of the surface energy mismatch is set to two, for example, the upper limited value is not particularly restricted.

As the metal satisfying the above-mentioned requirement (s), Al, Ta, Hf, Y, Ga and Bi can be exemplified when the constituent material of the composite pinned layer 13 is Fe, Co and/or Ni. Alternatively, Zr can be exemplified when the constituent material of the composite pinned layer 13 is Co and/or Ni. Alternatively, Ti can be exemplified when the constituent material of the composite pinned layer 13 is Ni. Ta, Ti, Zr and Hf satisfies the former requirement (larger surface energy), and Al, Y, Ga and Bi satisfies the latter requirement (smaller surface energy and the surface energy mismatch of 0.5 or more).

In the magneto-resistance effect element 10 in FIG. 1, the compound portions 143 are formed so as to cover all of the side surfaces of the magnetic metal portions 142, respectively. As a result, the boundaries, that is, the wall surfaces of the insulating portions 141 are flattened by the compound portions 143 so that the variation loss in resistance at the wall surfaces of the magnetic metal portions 142 due to electron scattering can be prevented and thus, the magneto-resistance effect element can exhibit a larger MR effect.

The compound portions 143 functions as protective layers for the magnetic metal portions 142. Namely, the compound portions 143 function as preventing the diffusion of the oxygen remaining in the insulating portions 141 into the magnetic metal portions 142 with time and the disappearance of the magnetic metal portions 142 partially or entirely through oxidation. Therefore, the current path of the intermediate layer 14 (the magneto-resistance effect element 10) can be stably maintained so as to exhibit the intended MR effect for a long time.

In FIG. 1, the compound portions 143 are required to cover all of the side surfaces of the magnetic metal portions 142, but not always required. Concretely, the compound portions 143 are required to cover at least portions of the side surfaces of the magnetic metal portions 142. As illustrated in FIG. 1, however, it is desired that the compound portions 143 cover all of the side surfaces of the magnetic metal portions 142.

The free layer (magnetic free layer) 15 may be made of a ferromagnetic material such as Fe, Co, Ni, FeCo alloy and FeNi alloy of which the magnetization is rotated in accordance with the external magnetic field. In this embodiment, the free layer 15 is made of a single layer, but may be of a multilayered structure.

The protective layer 16 functions as protecting the spin valve film. For example, the protective layer 16 may be made of a three-layered structure of Cu/Ta/Ru.

(Method For Manufacturing a Magneto-resistance Effect Element)

Hereinafter, the manufacturing method of the magneto-resistance effect element 10 will be described. First of all, the bottom electrode LE, the underlayer 11, the antiferromagnetic layer 12, the composite pinned layer 13, the intermediate layer 14, the free layer 15, the protective layer 16 and the top electrode UE are subsequently formed on a given substrate. Normally, the bottom electrode LE through the top electrode UE are formed under a depressurized atmosphere. Next, the forming method of each layer will be described.

(1) Formation of Bottom Electrode LE through Antiferromagnetic Layer 12

First of all, the bottom electrode LE is formed on the substrate by means of micro processing. Then, the underlayer 11 and the ferromagnetic layer 12 are formed on the bottom electrode LE.

(2) Formation of Composite Pinned Layer 13

The first pinned layer 131, the antiparallel-magnetic coupling layer 132 and the second pinned layer 133 are formed subsequently. In this case, a non-ferromagnetic metal layer or an alloy layer made of the constituent material of the pinned layer 133 and the non-ferromagnetic metal may be formed on the second pinned layer 133.

(3) Formation of Intermediate Layer 14

FIGS. 2 to 6 relate to the forming process of the intermediate layer 14. In these drawings, the concrete structure of each component is simplified (omitted) for clarifying the features of the forming process.

Figure 2:
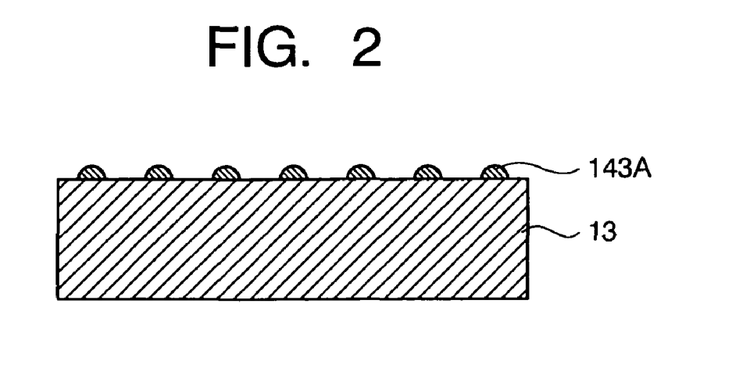
FIG. 2 is a cross sectional view illustrating a step in a method for forming the intermediate layer of the magneto-resistance effect element in FIG. 1.

In the formation of the intermediate layer 14, first of all, as illustrated in FIG. 2, a plurality of metallic portions 143A are formed on the composite pinned layer 13. The metallic portions 143A are shaped in island so as to be separated from one another. Then, the metal with a larger surface energy than Fe, Co, Ni composing the composite pinned layer 13 is deposited on the composite pinned layer 143 by means of sputtering or the like. Alternatively, the metal which has a smaller surface energy than Fe, Co, Ni composing the composite pinned layer 13 and which satisfies the relation of $\Gamma_{AB}=2|(\gamma_A-\gamma_B)/(\gamma_A+\gamma_B)| \geq 0.5$ is deposited on the composite pinned layer 143 by means of sputtering or the like. As described above, the surface energy of the constituent material (Fe, Co, Ni, etc.) is defined as $\gamma_A$ and the surface energy of the metal is defined as $\gamma_B$. The relation of $\Gamma_{AB}=2|(\gamma_A-\gamma_B)/(\gamma_A+\gamma_B)|$ means a surface energy mismatch.

As the metal satisfying the above-mentioned requirement (s), Al, Ta, Hf, Y, Ga and Bi can be exemplified when the constituent material of the composite pinned layer 13 is Fe, Co and/or Ni. Alternatively, Zr can be exemplified when the constituent material of the composite pinned layer 13 is Co and/or Ni. Alternatively, Ti can be exemplified when the constituent material of the composite pinned layer 13 is Ni. Ta, Ti, Zr and Hf satisfies the former requirement (larger surface energy), and Al, Y, Ga and Bi satisfies the latter requirement (smaller surface energy and the surface energy mismatch of 0.5 or more).

The upper limited value of the surface energy mismatch is set to two, but may not be particularly restricted.

Figure 3:
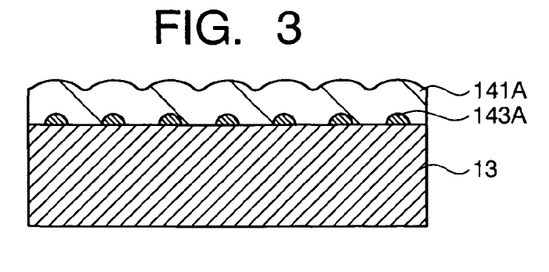
FIG. 3 is a cross sectional view illustrating a step after the step illustrated in FIG. 2.
Figure 4:
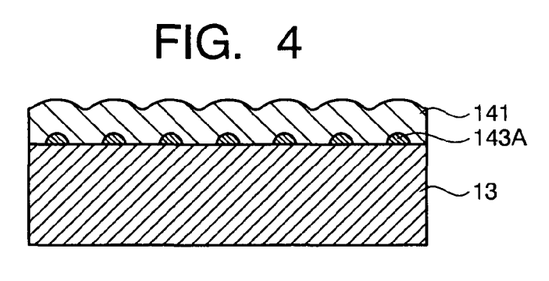
FIG. 4 is a cross sectional view illustrating a step after the step illustrated in FIG. 3.

Then, as shown in FIG. 3, a metallic layer 141A such as an Al layer (in the case that the metallic portions 143A are made of another metallic material except Al) is formed so as to embed the metallic portions 143A. Then, the metallic portions 141A are oxidized, nitrided, oxynitrided or carbonized so as to be insulated. As a result, the insulating portions 141 are formed as shown in FIG. 4. The concrete process of the oxidizing, nitriding, oxynitriding or carbonizing is not restricted, but may be conducted by means of natural exposure, ion assist, RF plasma exposure, ion beam exposure or radical exposure. Alternatively, the insulating portions 141 can be directly made of the oxide, nitride, oxynitride or carbide. Then, some energy is applied onto the laminated body under fabrication by means of RF plasma treatment, ion beam treatment, or thermal treatment. The energy application such as RF plasma treatment, ion beam treatment, or thermal treatment may be appropriately selected or combined with one another.

Figure 5:
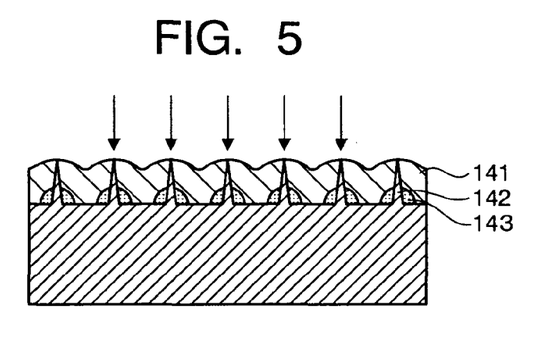
FIG. 5 is a cross sectional view illustrating a step after the step illustrated in FIG. 4.
Figure 6:
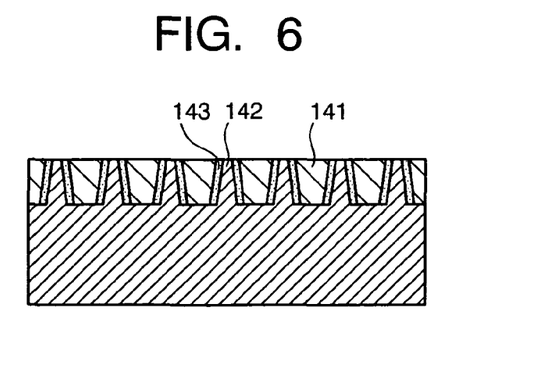
FIG. 6 is a cross sectional view illustrating a step after the step illustrated in FIG. 5.

In this case, as shown in FIG. 5, the constituent component (s) of the composite pinned layer 13 is (are) pumped up and diffused into the center portions of the metallic portions 143A. With the diffusion of the constituent component(s) of the composite pinned layer 13, excess oxygen in the insulating portions 141 is incorporated in the outer areas of the metallic portions 143A. As a result, as shown in FIG. 6, the metallic portions 143A are converted into the magnetic metal portions 142 made of the constituent element(s) (metal(s)) of the composite pinned layer 13 and the compound portions 143 located outside the magnetic metal portions 142, respectively. The insulating portions 141 are located between the adjacent magnetic metal portions 142, respectively.

In this way, the intermediate layer 14 is formed so as to be configured such that the insulating portions 141 and the magnetic metal portions 142 are alternately disposed and the compound portions 143 cover the side surfaces of the magnetic metal portions 142.

In this embodiment, as shown in FIGS. 4 and 5, the magnetic metal portions 142 and the compound portions 143 are formed by the application of energy after the insulating portions 141 are formed, and vice versa. Namely, as shown in FIG. 3, the metallic layer 141A is formed and then, the magnetic metal portions 142 are formed in the corresponding metallic portions 143A by the application of energy. Then, the metallic layer 141A is insulated to form the insulating portions 141 while the compound portions 143 are formed by the excess oxygen.

The selection in material of the metallic layer 141A and the metallic portions 143A is conducted so that the easiness of the oxidizing, nitriding, oxynitriding and carbonizing satisfies the order of the metallic layer 141A> the metallic portions 143A> the composite pinned layer 13. If the requirement is not satisfied, the steps as shown in FIGS. 4 and 5 can not be subsequently conducted.

(4) Formation of Free Layer 15, Protective Layer 16 and Top electrode UE

Then, the free layer 15 is formed on the intermediate layer 14 and then, the protective layer 16 and the top electrode layer UE are formed subsequently. As a result, the intended magneto-resistance effect element 10 can be manufactured.

(5) Thermal Treatment

Then, the magneto-resistance effect element 10 is thermally treated under a magnetic field so as to fix the magnetization of the first pinned layer 131.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 7:
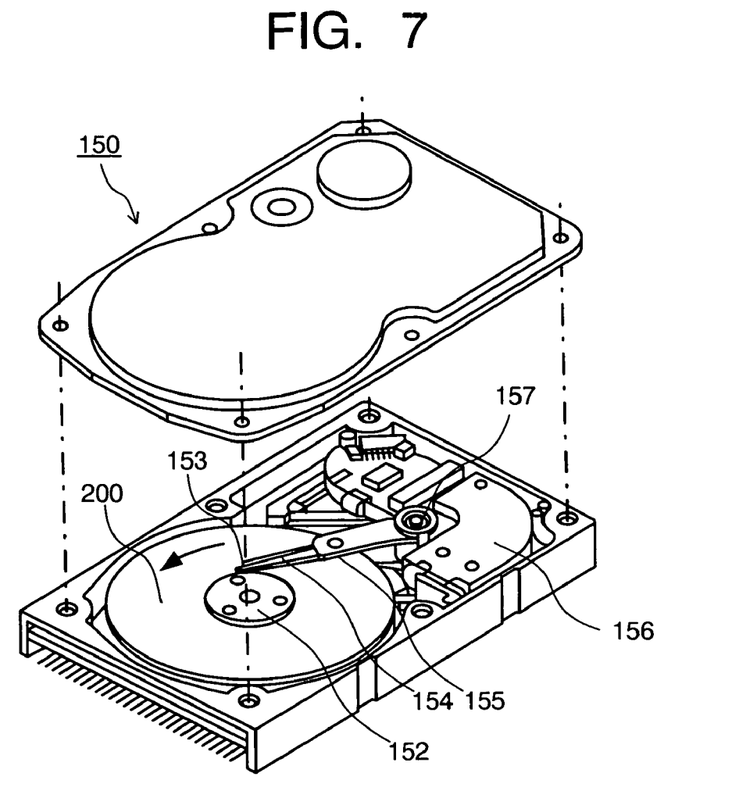
FIG. 7 is a perspective view illustrating a magnetic recording/reproducing device according to the present invention.

FIG. 7 is a perspective view illustrating the schematic structure of the magnetic recording/reproducing device. The magnetic recording/reproducing device 150 illustrated in FIG. 7 constitutes a rotary actuator type magnetic recording/reproducing device. In FIG. 7, a magnetic recording disk 200 is mounted to a spindle 152 to be turned in the direction designated by the arrow A by a motor (not shown) which is driven in response to control signals from a drive unit controller (not shown). In FIG. 7, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 8:
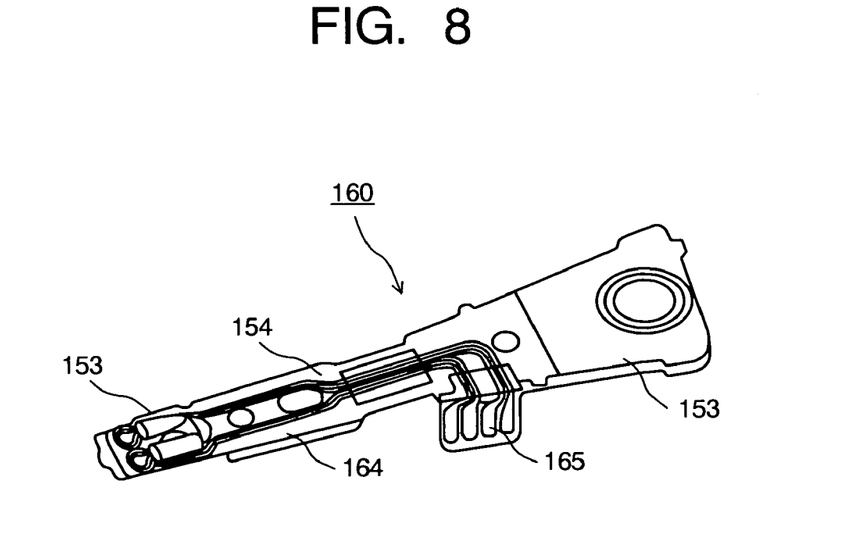
FIG. 8 is an enlarged perspective view illustrating the magnetic head assembly of the magnetic recording/reproducing device in FIG. 7, as viewed from the side of a disk.

FIG. 8 is an enlarged perspective view illustrating a portion of the magnetic head assembly positioned at the tip side thereof from the actuator arm 155, as viewed from the side of the magnetic recording disk 200. As illustrated in FIG. 8, the magnetic head assembly 160 has the actuator arm 155 with the bobbin portion supporting the driving coil and the like. The suspension 154 is connected with the one edge of the actuator arm 155.

Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 7 and 8, since the magneto-resistance effect element as described in the above embodiments is installed, the information magnetically recorded in the magnetic recording disk 200 under higher density recording than normal recording can be read out properly.

EXAMPLES

The present invention will be described in detail in view of Examples.

Example 1

Example 1 relating to the magneto-resistance effect element 10 will be described. In Example 1, the magneto-resistance effect element 10 was formed as follows:
Underlayer 11: Ta 5 nm/NiFeCr 7 nm
Antiferromagnetic layer 12: PtMn 15 nm
First pinned layer 131: $Co_9Fe_1$ 3.3 nm
Antiparallel magnetic coupling layer 132: Ru 0.9 nm
Second pinned layer 132: $Fe_5CO_5$ 2.5 nm
Metal to be compound layer: Ta 0.02 nm
Metal to be insulating layer: Al 0.9 nm (an Al layer is formed, naturally oxidized and heated)
Free layer 15: $Fe_5CO_5$ 2.5 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 1 was larger than the variation ratio in resistance of a magneto-resistance effect element with no metal to be a compound layer. Moreover, the resistance of the magneto-resistance effect element 10 in Example 1 was smaller than the resistance of the magneto-resistance effect element with no metal to be a compound layer.

Example 2

Example 2 relating to the magneto-resistance effect element 10 will be described. In Example 2, the magneto-resistance effect element 10 was formed as follows:
Underlayer 11: Ta 5 nm/Ru 2 nm
Antiferromagnetic layer 12: PtMn 15 nm
First pinned layer 131: $Co_9Fe_1$ 3.3 nm
Antiparallel-magnetic coupling layer 132: Ru 0.9 nm
Second pinned layer 132: $Fe_5CO_5$ 2.5 nm
Metal to be compound layer: Ta 0.02 nm
Metal to be insulating layer: Al 0.9 nm (an Al layer is formed, naturally oxidized and heated)
Free layer 15: $Fe_5CO_5$ 2.5 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 2 was larger than the variation ratio in resistance of a magneto-resistance effect element with no metal to be a compound layer. Moreover, the resistance of the magneto-resistance effect element 10 in Example 2 was smaller than the resistance of the magneto-resistance effect element with no metal to be a compound layer.

Example 3

Example 3 relating to the magneto-resistance effect element 10 will be described. In Example 3, the magneto-resistance effect element 10 was formed as follows:
Underlayer 11: Ta 5 nm/Ru 2 nm
Antiferromagnetic layer 12: IrMn 10 nm
First pinned layer 131: $Co_9Fe_1$ 3.3 nm
Antiparallel-magnetic coupling layer 132: Ru 0.9 nm
Second pinned layer 132: $Fe_5CO_5$ 2.5 nm
Metal to be compound layer: Ta 0.02 nm
Metal to be insulating layer: $Al_2O_3$ 1.2 nm (an $Al_2O_3$ layer is formed and heated)
Free layer 15: $Fe_5CO_5$ 2.5 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 3 was larger than the variation ratio in resistance of a magneto-resistance effect element with no metal to be a compound layer. Moreover, the resistance of the magneto-resistance effect element 10 in Example 3 was smaller than the resistance of the magneto-resistance effect element with no metal to be a compound layer.

Example 4

Example 4 relating to the magneto-resistance effect element 10 will be described. In Example 4, the magneto-resistance effect element 10 was formed as follows:
Underlayer 11: Ta 5 nm/Ru 2 nm
Antiferromagnetic layer 12: IrMn 10 nm
First pinned layer 131: $Co_9Fe_1$ 3.3 nm
Antiparallel-magnetic coupling layer 132: Ru 0.9 nm
Second pinned layer 132: $Fe_5CO_5$ 2.5 nm
Metal to be compound layer: Ta 0.02 nm
Metal to be insulating layer: $Al_2O_3$ 1.2 nm (an $Al_2O_3$ layer is formed, and ion-treated)
Free layer 15: $Fe_5CO_5$ 1 nm/$Ni_8Fe_2$ 2 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 4 was larger than the variation ratio in resistance of a magneto-resistance effect element with no metal to be a compound layer. Moreover, the resistance of the magneto-resistance effect element 10 in Example 4 was smaller than the resistance of the magneto-resistance effect element with no metal to be a compound layer.

Example 5

Example 5 relating to the magneto-resistance effect element 10 will be described. In Example 5, the magneto-resistance effect element 10 was formed as follows:
Underlayer 11: Ta 5 nm/NiFeCr 7 nm
Antiferromagnetic layer 12: PtMn 15 nm
First pinned layer 131: $Co_9Fe_1$ 3.3 nm
Antiparallel-magnetic coupling layer 132: Ru 0.9 nm
Second pinned layer 132: $Fe_5CO_5$ 2.5 nm
Metal to be compound layer: Ta 0.02 nm
Metal to be insulating layer: Al 0.9 nm (an Al layer is formed, ion-assisted and heated)
Free layer 15: $Fe_5CO_5$ 1 nm/$Ni_8Fe_2$ 2 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 5 was larger than the variation ratio in resistance of a magneto-resistance effect element with no metal to be a compound layer. Moreover, the resistance of the magneto-resistance effect element 10 in Example 5 was smaller than the resistance of the magneto-resistance effect element with no metal to be a compound layer.

Example 6

Example 6 relating to the magneto-resistance effect element 10 will be described. In Example 6, the magneto-resistance effect element 10 was formed as follows:
Underlayer 11: Ta 5 nm/Ru 2 nm
Antiferromagnetic layer 12: IrMn 7 nm
First pinned layer 131: $CO_7Fe_3$ 3 nm
Antiparallel-magnetic coupling layer 132: Ru 0.9 nm
Second pinned layer 132: $Fe_5CO_5$ 2.5 nm
Metal to be compound layer: Ta 0.02 nm
Metal to be insulating layer: $Al_{90}B_{10}$ 0.9 nm (an $Al_{90}B_{10}$ layer is formed, ion-assisted and ion-treated)
Free layer 15: $Fe_9Co_1$ 1 nm/$Ni_8Fe_2$ 2 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 6 was larger than the variation ratio in resistance of a magneto-resistance effect element with no metal to be a compound layer. Moreover, the resistance of the magneto-resistance effect element 10 in Example 6 was smaller than the resistance of the magneto-resistance effect element with no metal to be a compound layer.

Example 7

Example 7 relating to the magneto-resistance effect element 10 will be described. In Example 7, the magneto-resistance effect element 10 was formed as follows:
Underlayer 11: Ta 5 nm/Ru 2 nm
Antiferromagnetic layer 12: IrMn 7 nm
First pinned layer 131: $CO_7Fe_3$ 3 nm
Antiparallel-magnetic coupling layer 132: Ru 0.9 nm
Second pinned layer 132: $Fe_5CO_5$ 2.5 nm
Metal to be compound layer: Ta 0.02 nm
Metal to be insulating layer: Al 0.9 nm (an Al layer is formed, nitrided by means of ion assist and ion-treated)
Free layer 15: $Fe_9Co_1$ 1 nm/$Ni_8Fe_2$ 2 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 7 was larger than the variation ratio in resistance of a magneto-resistance effect element with no metal to be a compound layer. Moreover, the resistance of the magneto-resistance effect element 10 in Example 7 was smaller than the resistance of the magneto-resistance effect element with no metal to be a compound layer.

Example 8

Example 8 relating to the magneto-resistance effect element 10 will be described. In Example 8, the magneto-resistance effect element 10 was formed as follows:
Underlayer 11: Ta 5 nm/Ru 2 nm
Antiferromagnetic layer 12: IrMn 7 nm
First pinned layer 131: $CO_7Fe_3$ 3 nm
Antiparallel-magnetic coupling layer 132: Ru 0.9 nm
Second pinned layer 132: $Fe_5CO_5$ 2.5 nm
Metal to be compound layer: Al 0.03 nm
Metal to be insulating layer: Hf 0.9 nm (a Hf layer is formed, oxidized by means of ion assist and thermally treated)
Free layer 15: $Fe_9CO_1$ 1 nm/$Ni_8Fe_2$ 2 nm
Protective layer 16: Cu 1 nm/Ta 2 nm/Ru 15 nm The thus obtained magneto-resistance effect element 10 was thermally treated at 270° C. during 10 hours under magnetic field. The variation ratio in resistance of the magneto-resistance effect element 10 in Example 8 was larger than the variation ratio in resistance of a magneto-resistance effect element with no metal to be a compound layer. Moreover, the resistance of the magneto-resistance effect element 10 in Example 8 was smaller than the resistance of the magneto-resistance effect element with no metal to be a compound layer.

In another Example relating to the magneto-resistance effect element 10 with another metal to be a compound layer, the variation ratio in resistance of the magneto-resistance effect element 10 was larger than the variation ratio in resistance of a magneto-resistance effect element with no metal to be a compound layer. Moreover, the resistance of the magneto-resistance effect element 10 was smaller than the resistance of the magneto-resistance effect element with no metal to be a compound layer.

Although the present invention was described in detail with reference to the above examples, this invention is not limited to the above disclosure and every kind of variation and modification may be made without departing from the scope of the present invention.

In the application of the magneto-resistance effect element to a reproducing magnetic head, if a top and bottom shields are added to the magneto-resistance effect element, the detecting resolution of the magnetic head can be defined.

Moreover, the magneto-resistance effect element can be applied for both of a longitudinal magnetic recording type magnetic head and a vertical magnetic recording type magnetic head. Also, the magneto-resistance effect element can be applied for both of a longitudinal magnetic recording/reproducing device and a vertical magnetic recording/reproducing device.

The magnetic recording/reproducing device may be a so-called stationary type magnetic device where a specific recording medium is installed therein or a so-called removable type magnetic device where a recording medium can be replaced.

What is claimed is:

1. A magneto-resistance effect element, comprising:
   a laminated body including a fixed magnetization layer of which a magnetization is substantially fixed in one direction, a free magnetization layer of which a magnetization is rotated in accordance with an external magnetic field, and an intermediate layer which is located between said fixed magnetization layer and said free magnetization layer; and
   a pair of electrodes for flowing a sense current perpendicular to a film surface of said laminated body, said electrodes being connected with a top surface and a bottom surface of said laminated body, respectively,
   wherein said intermediate layer contains an insulating portion, a magnetic metal portion penetrating through said insulating portion and a compound portion to cover at least a side surface of said magnetic metal portion; and
   wherein said compound portion contains at least one element selected from the group consisting of Al, Ta, Hf, Y, Ga and Bi when said magnetic metal portion contains at least one element selected from the group consisting of Fe, Co and Ni or said compound portion contains Zr when said magnetic metal portion contains at least one element of the group consisting of Co and Ni.

2. The magneto-resistance effect element as set forth in claim 1,
   wherein said compound portion contains a main component different from a main component of said insulating portion or said magnetic metal portion.

3. The magneto-resistance effect element as set forth in claim 2,
   wherein said compound portion contains a metal with a larger surface energy than a constituent material of said fixed magnetization layer.

4. The magneto-resistance effect element as set forth in claim 2,
   wherein said compound portion contains a metal which has a smaller surface energy than a constituent material of said fixed magnetization layer and which satisfies a relation of $\Gamma_{AB}=2|(\gamma_A-\gamma_B)/(\gamma_A+\gamma_B)|\geq 0.5$ meaning a surface energy mismatch if a surface energy of said constituent material is defined as $\gamma_A$ and a surface energy of said metal is defined as $\gamma_B$.

5. The magneto-resistance effect element as set forth in claim 1,
   wherein said compound portion contains at least one of oxygen, nitrogen and carbon.

6. The magneto-resistance effect element as set forth in claim 1,
   wherein said insulating portion contains at least one of oxygen, nitrogen and carbon.

7. The magneto-resistance effect element as set forth in claim 1,
   wherein said magnetic metal portion contains at least one component of said fixed magnetization layer.

8. The magneto-resistance effect element as set forth in claim 7,
   wherein said magnetic metal portion contains at least one of Fe, Co and Ni.

9. A magnetic head comprising a magneto-resistance effect element as set forth in claim 1.

10. A magnetic recording/reproducing device comprising a magnetic head as set forth in claim 9.

11. A method for manufacturing a magneto-resistance effect element, comprising:
    forming a plurality of island-shaped metallic portions which are separated from one another and which are formed on a fixed magnetization layer;
    forming a metallic layer on said fixed magnetization layer so as to embed said metallic portions;
    oxidizing, nitriding, oxynitriding or carbonizing said metallic layer;
    applying an energy to said metallic portions and said fixed magnetization layer so that at least one component of said fixed magnetization layer is pumped up and diffused into center portions of said metallic layer so as to form magnetic metal portions containing said at least one component of said fixed magnetization layer in the corresponding metallic portions, thereby forming an intermediate layer configured so as to contain said magnetic metal portions, insulating portions located between adjacent magnetic metal portions and compound portions to cover at least portions of side surfaces of said magnetic metal portions;
    forming a free magnetization layer on said intermediate layer so as to form a laminated body comprising said fixed magnetization layer, said intermediate layer and said free magnetization layer; and
    forming a pair of electrodes for flowing a sense current perpendicular to a film surface of said laminated body, said electrodes being connected with a top surface and a bottom surface of said laminated body, respectively.

12. The method as set forth in claim 11,
    wherein each metallic portion contains a main component different from main components of each insulating portion and each magnetic metal portion.

13. The method as set forth in claim 11,
    wherein each metallic portion contains a metal with a larger surface energy than a constituent material of said fixed magnetization layer.

14. The method as set forth in claim 11,
    wherein each metallic portion contains a metal which has a smaller surface energy than a constituent material of said fixed magnetization layer and which satisfies a relation of $\Gamma_{AB}=2|(\gamma_A-\gamma_B)/(\gamma_A-\gamma_B)|\geq 0.5$ meaning a surface energy mismatch if a surface energy of said constituent material is defined as $\gamma_A$ and a surface energy of said metal is defined as $\gamma_B$.

15. A method for manufacturing a magneto-resistance effect element, comprising:
    forming a plurality of island-shaped metallic portions which are separated from one another and which are formed on a fixed magnetization layer of which a magnetization is substantially fixed in one direction;
    forming a metallic layer on said fixed magnetization layer so as to embed said metallic portions;
    applying an energy to said metallic portions and said fixed magnetization layer so that at least one component of said fixed magnetization layer is pumped up and diffused into center portions of said metallic layer so as to form magnetic metal portions containing said at least one component of said fixed magnetization layer in the corresponding metallic portions;
    oxidizing, nitriding, oxynitriding or carbonizing said metallic layer, thereby forming an intermediate layer configured so as to contain said magnetic metal portions, insulating portions located between adjacent magnetic metal portions and compound portions to cover at least portions of side surfaces of said magnetic metal portions;

forming a free magnetization layer on said intermediate layer so as to form a laminated body comprising of said fixed magnetization layer, said intermediate layer and said free magnetization layer; and forming a pair of electrodes for flowing a sense current perpendicular to a film surface of said laminated body, said electrodes being connected with a top surface and a bottom surface of said laminated body, respectively.

16. The method as set forth in claim 15, wherein each metallic portion contains a main component different from main components of each insulating portion and each magnetic metal portion.

17. The method as set forth in claim 15, wherein each metallic portion contains a metal with a larger surface energy than a constituent material of said fixed magnetization layer.

18. The method as set forth in claim 15, wherein each metallic portion contains a metal which has a smaller surface energy than a constituent material of said fixed magnetization layer and which satisfies a relation of $\Gamma_{AB}=2|(\gamma_A-\gamma_B)/(\gamma_A-\gamma_B)|\geqq 0.5$ meaning a surface energy mismatch if a surface energy of said constituent material is defined as $\gamma_A$ and a surface energy of said metal is defined as $\gamma_B$.

\* \* \* \* \*

UNITED STATES PATENT AND TRADEMARK OFFICE
CERTIFICATE OF CORRECTION

PATENT NO. : 8,031,443 B2
APPLICATION NO. : 12/071589
DATED : October 4, 2011
INVENTOR(S) : Fuke et al.

It is certified that error appears in the above-identified patent and that said Letters Patent is hereby corrected as shown below:

On the title page, item [73] should read:

-- (73) Assignee: Kabushiki Kaisha Toshiba, Tokyo (JP)
TDK Corporation, Tokyo (JP) --

Signed and Sealed this
Twenty-fourth Day of September, 2013

Teresa Stanek Rea
*Deputy Director of the United States Patent and Trademark Office*